United States Patent
Diorio et al.

(10) Patent No.: US 7,472,835 B2
(45) Date of Patent: Jan. 6, 2009

(54) RFID SYSTEM COMPONENTS IMPLEMENTING ADJUSTED BACKSCATTER CALCULATIONS AND METHODS

(75) Inventors: Christopher J. Diorio, Shoreline, WA (US); Kurt E. Sundstrom, Woodinville, WA (US); Scott Anthony Cooper, Seattle, WA (US); Todd E. Humes, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 617 days.

(21) Appl. No.: 11/114,614

(22) Filed: Apr. 25, 2005

(65) Prior Publication Data

US 2006/0163370 A1 Jul. 27, 2006
US 2007/0221737 A2 Sep. 27, 2007
US 2008/0006702 A2 Jan. 10, 2008

Related U.S. Application Data

(60) Provisional application No. 60/646,267, filed on Jan. 21, 2005.

(51) Int. Cl.
*G06K 19/06* (2006.01)

(52) U.S. Cl. ........................... 235/492; 235/451
(58) Field of Classification Search ................ 235/451, 235/492; 340/10.1, 10.2, 572.1, 825.39
See application file for complete search history.

(56) References Cited

U.S. PATENT DOCUMENTS

| | | | |
|---|---|---|---|
| 3,938,316 A | 2/1976 | Morokawa et al. | |
| 4,454,483 A | 6/1984 | Baylor | |
| 5,117,756 A | 6/1992 | Goffin, II | |
| 5,453,748 A * | 9/1995 | Lindell | 342/51 |
| 5,583,819 A | 12/1996 | Roesner et al. | |
| 5,649,295 A * | 7/1997 | Shober et al. | 340/10.1 |
| 5,649,296 A * | 7/1997 | MacLellan et al. | 455/39 |
| 5,793,324 A * | 8/1998 | Aslanidis et al. | 342/51 |
| 5,867,535 A | 2/1999 | Phillips et al. | |
| 5,912,632 A | 6/1999 | Dieska et al. | |
| 6,046,683 A | 4/2000 | Pidwerbetsky et al. | |
| 6,243,013 B1 | 6/2001 | Duan et al. | |
| 6,356,161 B1 | 3/2002 | Nolan et al. | |

(Continued)

FOREIGN PATENT DOCUMENTS

WO WO-02065380 8/2002

(Continued)

OTHER PUBLICATIONS

Finkenzeller, Klaus, "Fundamental Operating Principles", *RFID Handbook: Fundamentals and Applications in Contactless Smart Cards and Identification*, John Wiley & Sons, Ltd ; ISBN 0-470-84402-7, (2003), 29-59.

(Continued)

*Primary Examiner*—Karl D. Frech
(74) *Attorney, Agent, or Firm*—Schwegman, Lundberg & Woessner, P.A.; Russel Slifer

(57) ABSTRACT

RFID system components, such as readers and tags, communicate by a reader transmitting waveforms that encode a calibration symbol and a divide ratio. Tags include a processor to determine a backscatter link period result by dividing a count value representing the calibration symbol by the divide ratio and adding an adjustment. Tags modulate a backscatter waveform that includes symbols using a link period determined from the result.

70 Claims, 15 Drawing Sheets

U.S. PATENT DOCUMENTS

| | | | |
|---|---|---|---|
| 6,388,532 | B1 | 5/2002 | Babcock |
| 6,404,325 | B1 | 6/2002 | Heinrich et al. |
| 6,472,943 | B1 | 10/2002 | Soong et al. |
| 6,639,509 | B1 | 10/2003 | Martinez |
| 7,246,751 | B2 * | 7/2007 | Diorio et al. ............... 235/492 |
| 2002/0167405 | A1 | 11/2002 | Shanks et al. |
| 2004/0150510 | A1 * | 8/2004 | Taki et al. ................ 340/10.1 |
| 2006/0145855 | A1 * | 7/2006 | Diorio et al. ............ 340/572.1 |
| 2007/0013484 | A1 * | 1/2007 | Carrender et al. ......... 340/10.4 |

FOREIGN PATENT DOCUMENTS

| | | |
|---|---|---|
| WO | WO-2006078882 A2 | 7/2006 |
| WO | WO-2006078882 A3 | 7/2006 |

OTHER PUBLICATIONS

"Search Report for International Application No. PCT/US06/0202", (Jan. 29, 2007), 3 pgs.

(A) EPCglobal, Inc. "Specification for RFID Air Interface-EPC Radio-Frequency Identity Protocols Class-1 Generation-2 UHF RFID Protocol for Communications at 860 MHz-960 MHz, Version 1.1.0." (a.k.a. "The Gen 2 Spec".) EPCglobal Inc., Dec. 17, 2005. <http://www.epcglobalinc.org>.

(B) EPCglobal Inc. "Specification for RFID Air Interface-EPC Radio-Frequency Identity Protocols Class-1 Generation-2 UHF RFID Protocol for Communications at 860 MHz-960 MHz, Version 1.0.8." EPCglobal Inc., Dec. 14, 2004. <http://www.epcglobalinc.org>.

(C) Declaration of Stacy L. Jones authenticating attached Website Materials as accessed and posted at http://www.autoid.org/SC31/sc_31_wg4_sg3.htm on Sep. 1, 2006.

"Application Serial No. PCT/US2006/002002, International Preliminary Report on Patentability Aug. 2, 2007", 5 pgs.

"International Search Report, PCT Application No. PCT/US06/2002", (Jan. 29, 2007), 3 pgs.

* cited by examiner

*RFID SYSTEM*

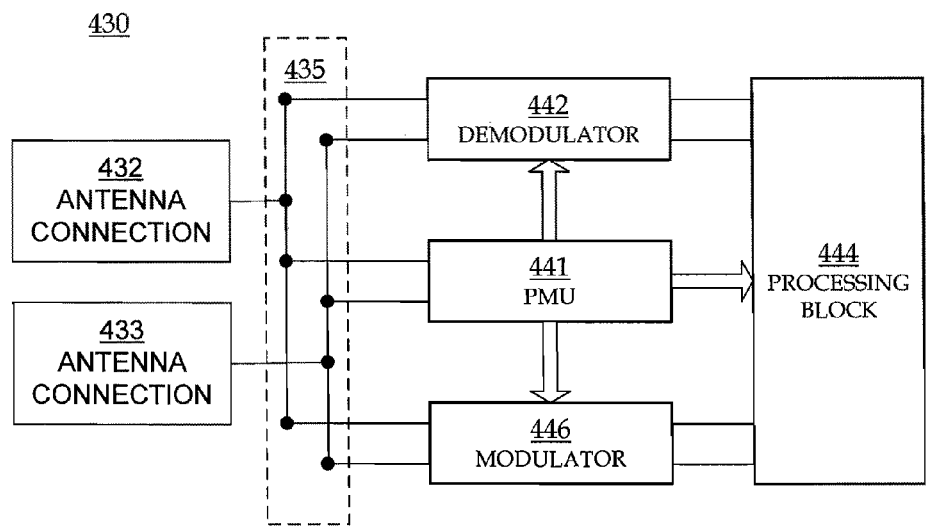
FIGURE 4
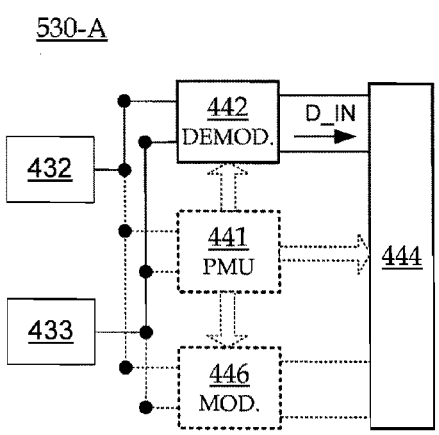 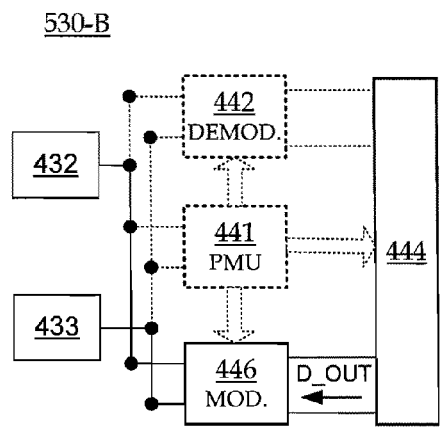
SIGNAL PATH DURING R→T         SIGNAL PATH DURING T→R
FIGURE 5A                      FIGURE 5B

PROCESSING BLOCK

COMMUNICATED FROM READER,
IN ONE OR MORE WAVEFORMS

DETERMINING BACKSCATTER PARAMETERS

1100

1155  1153        1158

24 / 8 = 3.000 → 3
25 / 8 = 3.125 → 3
26 / 8 = 3.250 → 3
27 / 8 = 3.375 → 3
28 / 8 = 3.500 → 3
29 / 8 = 3.625 → 3
30 / 8 = 3.750 → 3
31 / 8 = 3.875 → 3
32 / 8 = 4.000 → 4

1190

THE DIVISION IS APPROXIMATE, BECAUSE DIVIDING BY RIGHT-SHIFTING CAUSES CONSISTENT ROUNDING DOWN.

1500

*ADDING ADJUSTMENT AFTER DIVIDING*

1600

*ADDING ADJUSTMENT BEFORE DIVIDING*

*ADDING ADJUSTMENT BEFORE DIVIDING*

RFID SYSTEM COMPONENTS IMPLEMENTING ADJUSTED BACKSCATTER CALCULATIONS AND METHODS

RELATED APPLICATIONS

This application claims the benefit of U.S. Provisional Application Ser. No. 60/646,267 filed on Jan. 21, 2005, which is hereby claimed under 35 U.S.C. §119(e). The Provisional Application is incorporated herein by reference.

FIELD OF THE INVENTION

The present invention relates to Radio Frequency IDentification (RFID) systems, and more particularly, to an apparatus, a method, and a system of employing adjustments to backscatter calculations in RFID communication.

BACKGROUND OF THE INVENTION

Radio Frequency IDentification (RFID) systems typically include RFID tags and RFID readers (the latter are also known as RFID reader/writers or RFID interrogators). RFID systems can be used in many ways for locating and identifying objects to which the tags are attached. RFID systems are particularly useful in product-related and service-related industries for tracking large numbers of objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. A tag that senses the interrogating RF wave responds by transmitting back another RF wave. The tag generates the transmitted back RF wave either originally, or by reflecting back a portion of the interrogating RF wave in a process known as backscatter. Backscatter may take place in a number of ways.

The reflected back RF wave may further encode data stored internally in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on.

An RFID tag typically includes an antenna system, a power management section, a radio section, and frequently a logical section, a memory, or both. In earlier RFID tags, the power management section included a power storage device, such as a battery. RFID tags with a power storage device are known as active tags. Advances in semiconductor technology have miniaturized the electronics so much that an RFID tag can be powered solely by the RF signal it receives. Such RFID tags do not include a power storage device, and are called passive tags.

BRIEF DESCRIPTION OF THE DRAWINGS

FIG. 4 is a block diagram illustrating one embodiment of an electrical circuit that may be employed in an RFID tag such as the RFID tag of FIG. 1;

FIGS. 5A and 5B illustrate two versions of the electrical circuit of FIG. 4 emphasizing signal flow in receive and transmit operational modes of the RFID tag, respectively;

DETAILED DESCRIPTION

Figure 1:
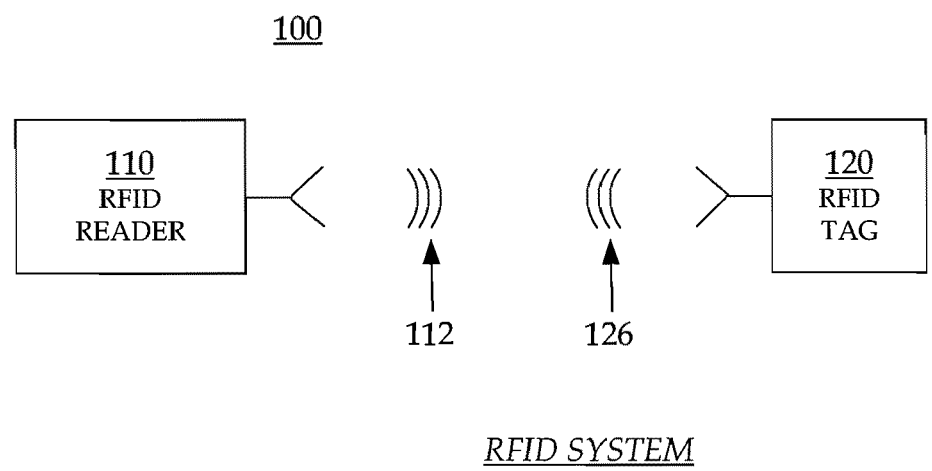
FIG. 1 illustrates a typical RFID system with an RFID reader and an RFID tag.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity. The terms "RFID reader" and "RFID tag" are used interchangeably with the terms "reader" and "tag", respectively, throughout the text and claims.

FIG. 1 is a diagram of a typical RFID system 100, incorporating aspects of the invention. An RFID reader 110 transmits an interrogating Radio Frequency (RF) wave 112. RFID tag 120 in the vicinity of RFID reader 110 may sense interrogating RF wave 112, and generate wave 126 in response. RFID reader 110 senses and interprets wave 126.

Reader 110 and tag 120 exchange data via wave 112 and wave 126. In a session of such an exchange, each encodes, modulates, and transmits data to the other, and each receives, demodulates, and decodes data from the other. The data is modulated onto, and decoded from, RF waveforms, as will be seen in more detail below.

Encoding the data can be performed in a number of different ways. For example, protocols are devised to communicate in terms of symbols, also called RFID symbols. A symbol for communicating can be a delimiter, a calibration symbol, and so on. Further symbols can be implemented for exchanging binary data, such as "0" and "1".

Tag 120 can be a passive tag or an active tag, i.e. having its own power source. Where tag 120 is a passive tag, it is powered from wave 112.

Figure 2:
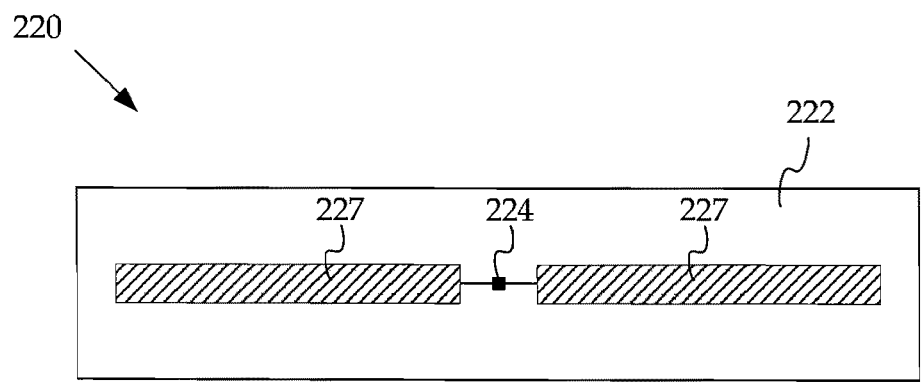
FIG. 2 is a diagram of an RFID tag such as the RFID tag shown in FIG. 1.

FIG. 2 is a diagram of an RFID tag 220. Tag 220 is implemented as a passive tag, meaning it does not have its own power source. Much of what is described in this document, however, applies also to active tags.

Tag 220 is formed on a substantially planar inlay 222, which can be made in many ways known in the art. Tag 220 also includes two antenna segments 227, which are usually flat and attached to inlay 222. Antenna segments 227 are shown here forming a dipole, but many other embodiments using any number of antenna segments are possible.

Tag 220 also includes an electrical circuit, which is preferably implemented in an integrated circuit (IC) 224. IC 224 is also arranged on inlay 222, and electrically coupled to antenna segments 227. Only one method of coupling is shown, while many are possible.

In operation, a signal is received by antenna segments 227, and communicated to IC 224. IC 224 both harvests power, and decides how to reply, if at all. If it has decided to reply, IC 224 modulates the reflectance of antenna segments 227, which generates the backscatter from a wave transmitted by the reader. Coupling together and uncoupling antenna segments 227 can modulate the reflectance, as can a variety of other means.

In the embodiment of FIG. 2, antenna segments 227 are separate from IC 224. In other embodiments, antenna segments may alternately be formed on IC 224, and so on.

The components of the RFID system of FIG. 1 may communicate with each other in any number of modes. One such mode is called full duplex. Another such mode is called half-duplex, and is described below.

Figure 3:
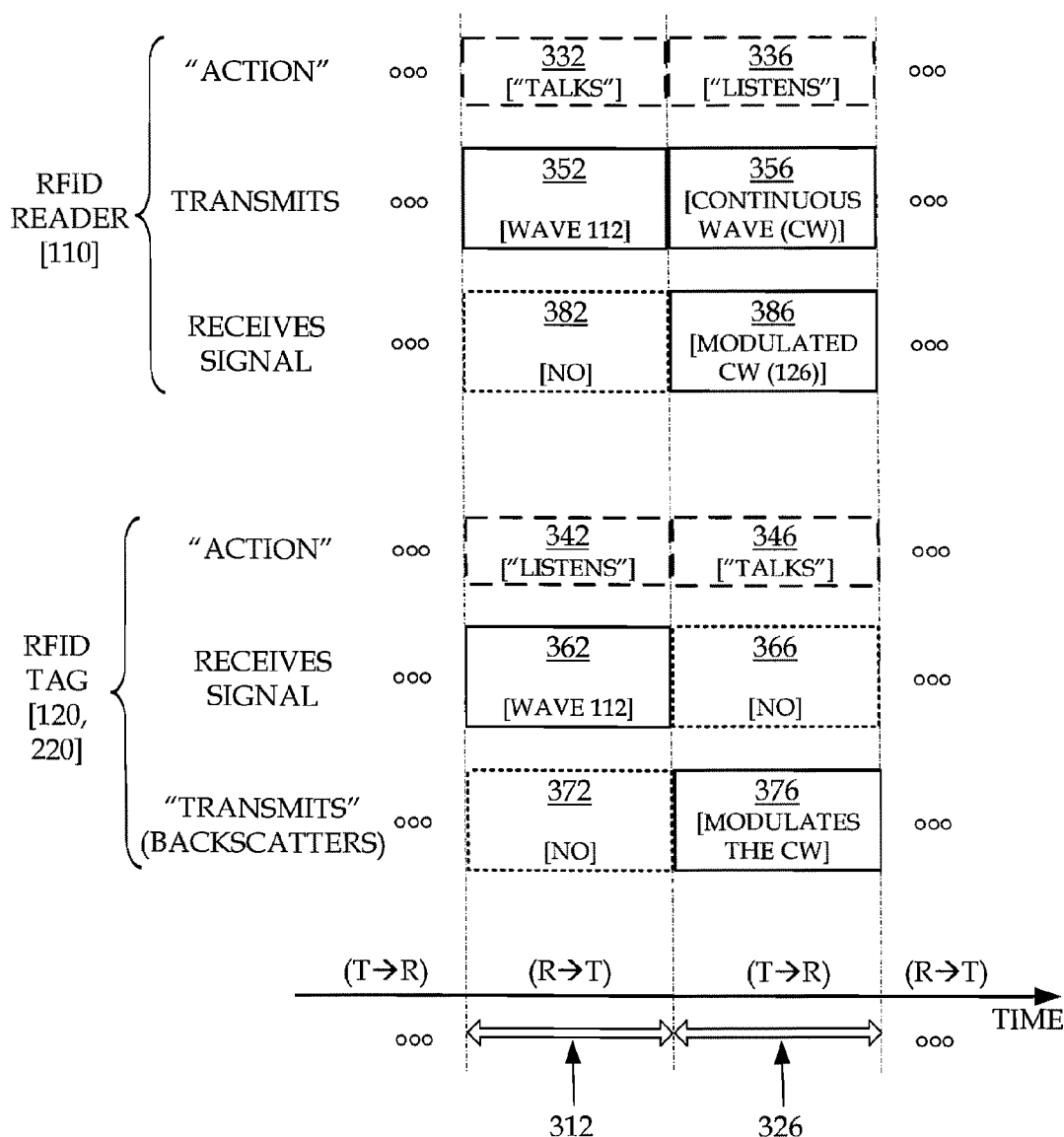
FIG. 3 is a conceptual diagram for explaining a half-duplex mode of communication between the components of the RFID system of FIG. 1.

FIG. 3 is a conceptual diagram 300 for explaining the half-duplex mode of communication between the components of the RFID system of FIG. 1, especially when tag 120 is implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the session is designated as "R→T", and when tag 120 talks to reader 110 the session is designated as "T→".

Along the TIME axis, a sample R→T session occurs during a time interval 312, and a following sample T→R session occurs during a time interval 326. Of course intervals 312, 326 can be of different durations—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual technical behavior, during interval 312, reader 110 talks to tag 120 as follows. According to block 352, reader 110 transmits wave 112, which was first described in FIG. 1. At the same time, according to block 362, tag 120 receives wave 112 and processes it. Meanwhile, according to block 372, tag 120 does not backscatter with its antenna, and according to block 382, reader 110 has no wave to receive from tag 120.

During interval 326, tag 120 talks to reader 110 as follows. According to block 356, reader 110 transmits a Continuous Wave (CW), which can be thought of as a carrier signal that ideally encodes no information. As discussed before, this carrier signal serves both to be harvested by tag 120 for its own internal power needs, and also as a wave that tag 120 can backscatter. Indeed, during interval 326, according to block 366, tag 120 does not receive a signal for processing. Instead, according to block 376, tag 120 modulates the CW emitted according to block 356, so as to generate backscatter wave 126. Concurrently, according to block 386, reader 110 receives backscatter wave 126 and processes it.

FIG. 4 is a block diagram of an electrical circuit 430. Circuit 430 may be formed in an IC of an RFID tag, such as IC 224 of FIG. 2. Circuit 430 has a number of main components that are described in this document. Circuit 430 may have a number of additional components from what is shown and described, or different components, depending on the exact implementation.

Circuit 430 includes at least two antenna connections 432, 433, which are suitable for coupling to one or more antenna segments (not shown in FIG. 4). Antenna connections 432, 433 may be made in any suitable way, such as pads and so on. In a number of embodiments more antenna connections are used, especially in embodiments where more antenna segments are used.

Circuit 430 includes a section 435. Section 435 may be implemented as shown, for example as a group of nodes for proper routing of signals. In some embodiments, section 435 may be implemented otherwise, for example to include a receive/transmit switch that can route a signal, and so on.

Circuit 430 also includes a Power Management Unit (PMU) 441. PMU 441 may be implemented in any way known in the art, for harvesting raw RF power received via antenna connections 432, 433. In some embodiments, PMU 441 includes at least one rectifier, and so on.

In operation, an RF wave received via antenna connections 432, 433 is received by PMU 441, which in turn generates power for components of circuit 430. This is true for either or both of R→T sessions (when the received RF wave carries a signal) and T→R sessions (when the received RF wave carries no signal).

Circuit 430 additionally includes a demodulator 442. Demodulator 442 demodulates an RF signal received via antenna connections 432, 433. Demodulator 442 may be implemented in any way known in the art, for example including an attenuator stage, amplifier stage, and so on.

Circuit 430 further includes a processing block 444. Processing block 444 receives the demodulated signal from demodulator 442, and may perform operations. In addition, it may generate an output signal for transmission.

Processing block 444 may be implemented in any way known in the art. For example, processing block 444 may include a number of components, such as a processor, a memory, a decoder, an encoder, and so on.

Circuit 430 additionally includes a modulator 446. Modulator 446 modulates an output signal generated by processing block 444. The modulated signal is transmitted by driving antenna connections 432, 433, and therefore driving the load presented by the coupled antenna segment or segments. Modulator 446 may be implemented in any way known in the art, for example including a driver stage, amplifier stage, and so on.

In one embodiment, demodulator 442 and modulator 446 may be combined in a single transceiver circuit. In another embodiment, modulator 446 may include a backscatter transmitter or an active transmitter.

It will be recognized at this juncture that circuit 430 can also be the circuit of an RFID reader according to the invention, without needing PMU 441. Indeed, an RFID reader can typically be powered differently, such as from a wall outlet, a battery, and so on. Additionally, when circuit 430 is configured as a reader, processing block 444 may have additional Inputs/Outputs (I/O) to a terminal, network, or other such devices or connections.

In terms of processing a signal, circuit 430 operates differently during a R→T session and a T→R session. The treatment of a signal is described below.

FIG. 5A shows version 530-A of circuit 430 of FIG. 4. Version 530-A shows the components of circuit 430 for a tag, further modified to emphasize a signal operation during a R→T session (receive mode of operation) during time interval 312 of FIG. 3. An RF wave is received from antenna connections 432, 433, a signal is demodulated from demodulator 442, and then input to processing block 444 as D_IN. In one embodiment according to the present invention, D_IN may include a received stream of symbols.

Version 530-A shows as relatively obscured those components that do not play a part in processing a signal during a R→T session. Indeed, PMU 441 may be active, and may be converting raw RF power. And modulator 446 generally does not transmit during a R→T session. Modulator 446 typically does not interact with the received RF wave significantly, either because switching action in section 435 of FIG. 4 decouples the modulator 446 from the RF wave, or by designing modulator 446 to have a suitable impedance, and so on.

While modulator 446 is typically inactive during a R→T session, it need not be always the case. For example, during a R→T session, modulator 446 could be active in other ways. For example, it could be adjusting its own parameters for operation in a future session.

FIG. 5B shows version 530-B of circuit 430 of FIG. 4. Version 530-B shows the components of circuit 430 for a tag, further modified to emphasize a signal operation during a T→R session during time interval 326 of FIG. 3. A signal is output from processing block 444 as D_OUT. In one embodiment according to the present invention, D_OUT may include a transmission stream of symbols. D_OUT is then modulated by modulator 446, and output as an RF wave via antenna connections 432, 433.

Version 530-B shows as relatively obscured those components that do not play a part in processing a signal during a T→R session. Indeed, PMU 441 may be active, and may be converting raw RF power. And demodulator 442 generally does not receive during a T→R session. Demodulator 442 typically does not interact with the transmitted RF wave, either because switching action in section 435 decouples the demodulator 442 from the RF wave, or by designing demodulator 442 to have a suitable impedance, and so on.

While demodulator 442 is typically inactive during a T→R session, it need not be always the case. For example, during a T→R session, demodulator 442 could be active in other ways. For example, it could be adjusting its own parameters for operation in a future session.

Figure 6:
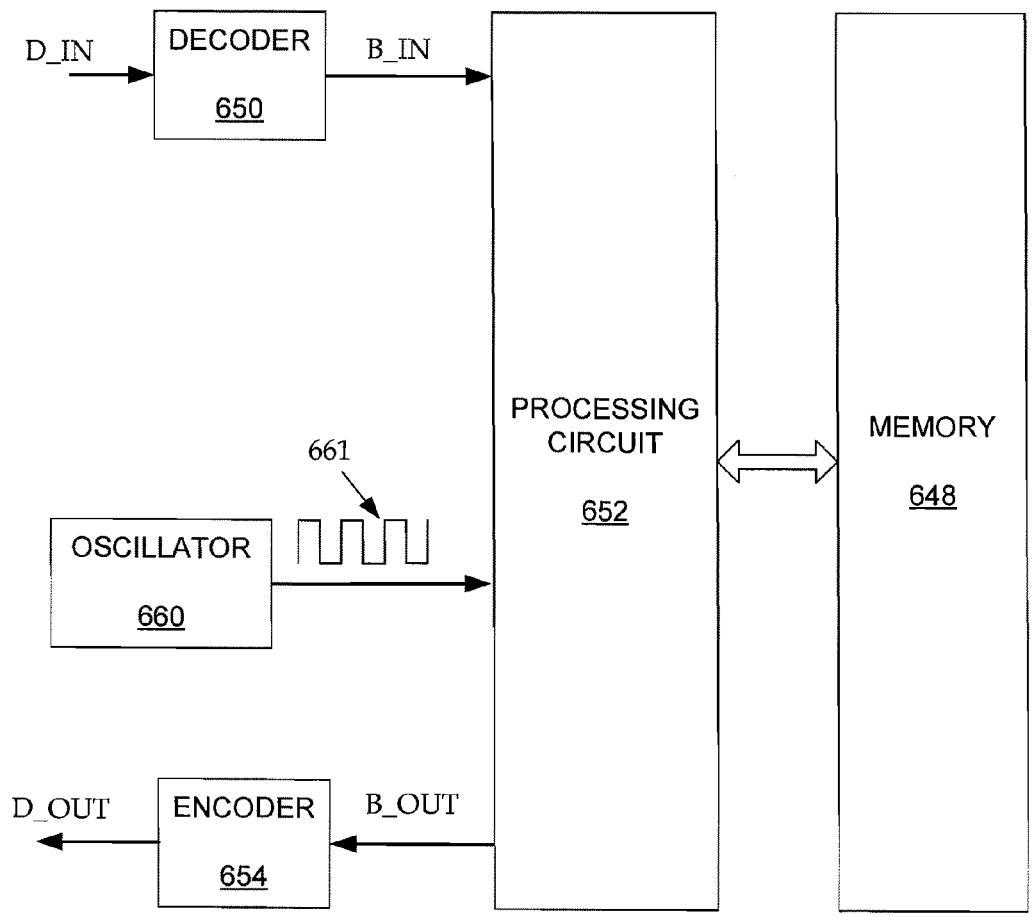
FIG. 6 illustrates one embodiment of a partial block diagram of the integrated circuit shown in FIG. 2.

FIG. 6 illustrates one embodiment of a partial block diagram of the integrated circuit 224 shown in FIG. 2. Specifically, a processing block 644 of the integrated circuit includes a memory 648, a signal decoder 650, a processing circuit 652, and an encoder 654. Decoder 650 decodes an input signal D_IN provided by a demodulator such as demodulator 442 of FIG. 4, and provides a decoded signal B_IN to the processing circuit 652. The processing circuitry processes the decoded signal, as described below, using a clock signal 661 provided by oscillator 660. The processing circuit 652 can interface with memory 648 while processing the decoded signal. The processing circuit 652 provides an output signal B_OUT to the encoder 654. The output signal D_OUT from the encoder is provided to a modulator circuit, such as modulator 446 of FIG. 4. Prior to explaining operation of the processing circuitry in greater detail, an explanation of prior art communications and signal processing is provided.

Figure 7:
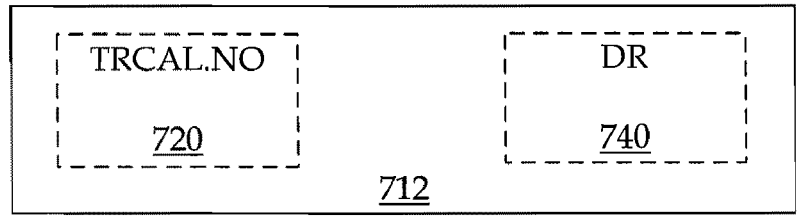
FIG. 7 is a conceptual diagram for explaining prior art communication from an RFID reader.

FIG. 7 is a conceptual diagram for explaining prior art communications from an RFID reader to RFID tags. Communication data 712 from a reader to tags includes a tag-to-reader calibration number (TRCAL.NO) 720 and a divide ratio (DR) 740. The calibration number TRCAL.NO is referred to herein as a gross number. The TRCAL.NO and DR are used by the RFID tag to calculate a backscatter link period. That is, the communication backscatter link period used by the RFID tags is determined in response to the reader communication waveform.

Figure 8:
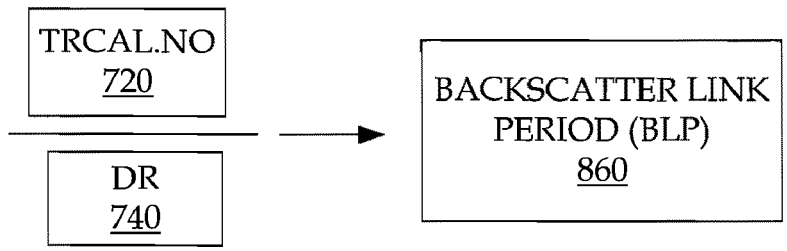
FIG. 8 is a conceptual diagram for explaining prior art method of determining a backscatter parameter.

FIG. 8 is conceptual diagram for explaining a prior art method 800 of determining a backscatter parameter. The tag processing circuitry divides the TRCAL.NO 720 by the DR 740 to determine the backscatter link period (BLP) 860.

Figure 9:
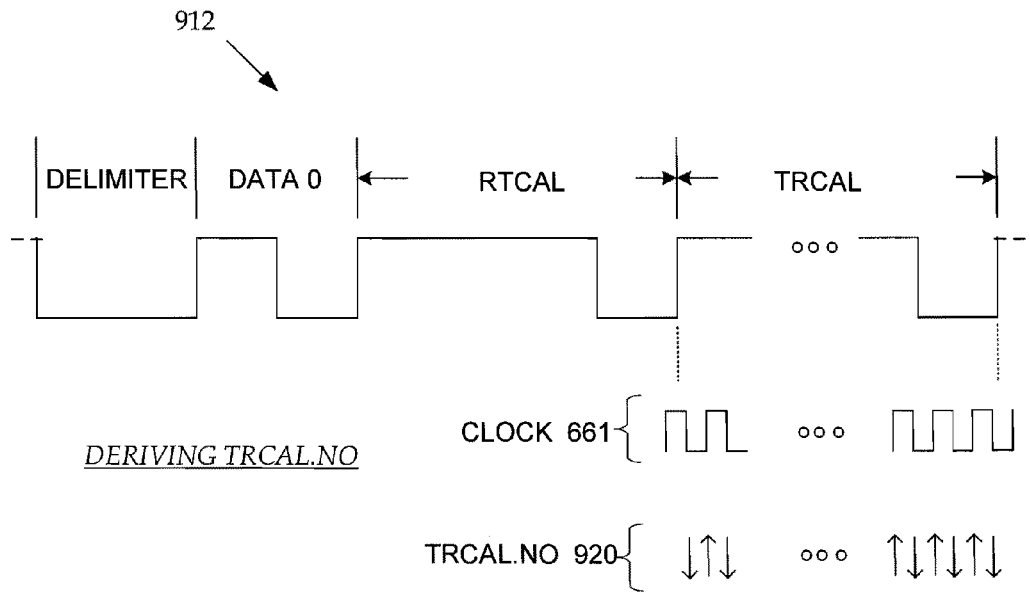
FIG. 9 illustrates a prior art determination of TRCAL.NO from a reader waveform.

Referring to FIG. 9, a prior art determination of TRCAL.NO from a reader waveform is described. A communication waveform signal 912 from a reader includes a delimiter pulse, a Data 0 symbol, an RTCAL symbol, and a TRCAL symbol. Those skilled in the art will appreciate that more or less symbols can be provided in the communication waveform 912, such as to provide a DR, data bits, and so on. Further, those skilled in the art will recognize that DR may be provided in an altogether separate communication from reader to tag. RFID tag processing circuitry (not shown) uses an internal clock signal 661 to measure a time duration of the TRCAL symbol. A TRCAL.NO 920 may be calculated by counting an integer number of edges of the clock signal during the TRCAL symbol.

Figure 10:
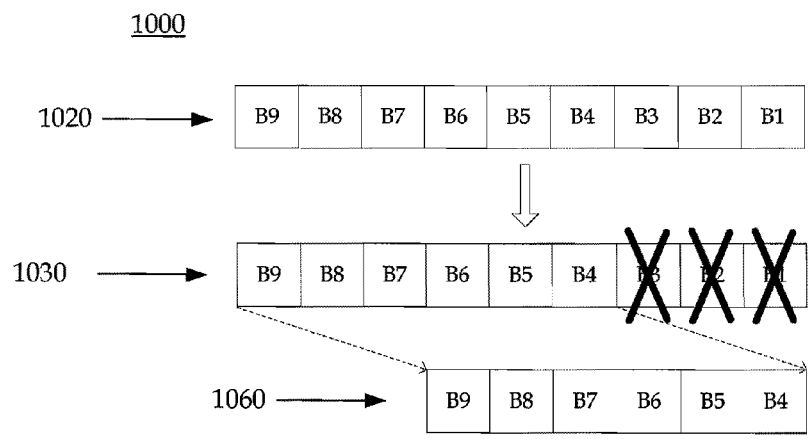
FIG. 10 illustrates a prior art dividing technique using right-shifting.

Because RFID tags need to operate at low power they cannot easily implement complex calculations. A prior art operation 1000 implements a divide 800 at low power by right-shifting, as illustrated in FIG. 10. An exemplary nine-bit TRCAL.NO gross value 1020 is divided by a DR of eight by right-shifting TRCAL.NO by three bit positions, as shown at 1030. That is, the three least significant bits, B1-B3, are discarded to provide a divided result 1060.

Figures 11, 12:
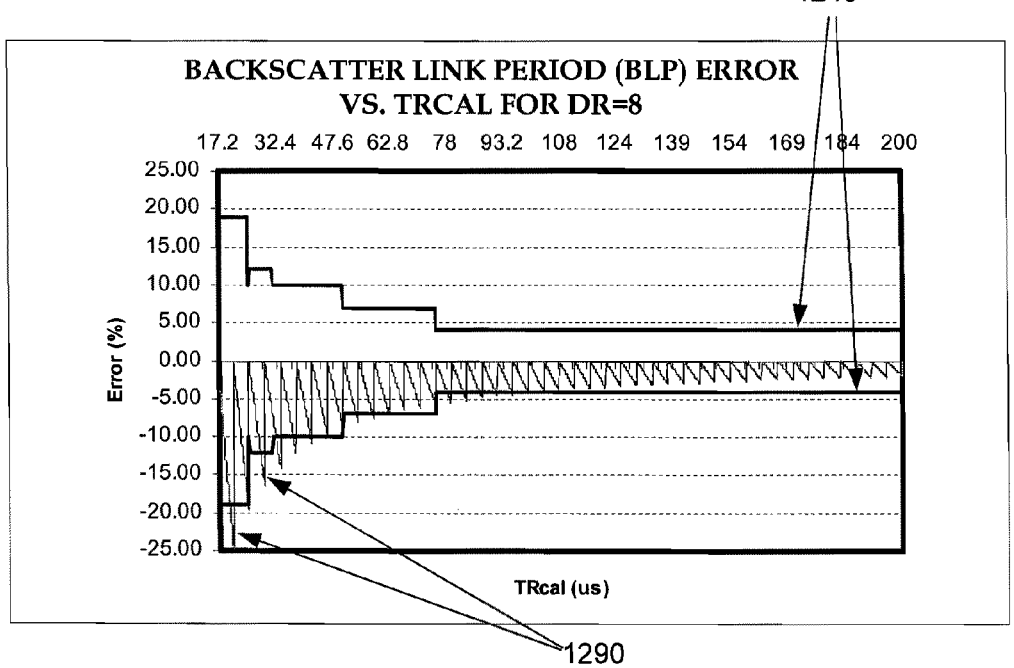
FIG. 11 illustrates results of the dividing technique of FIG. 10.
FIG. 12 illustrates error in determining the backscatter parameter using the dividing technique of FIG. 10.

FIG. 11 illustrates exemplary results 1100 of the dividing technique of FIG. 10. For TRCAL.NO 1155 having integer values in the range of 24 to 32 and a DR 1153 of eight, the right-shifted divide result 1158 is either three or four. As noted in comment box 1190, the division is approximate and the right-shifting operation causes a consistent rounding down until the division reaches the next larger integer result (i.e. reaches four in examples 1158).

FIG. 12 illustrates error 1200 in determining the BLP 860 using the dividing technique of FIG. 10. Current industry protocol allows a reader to communicate a TRCAL symbol length in the range of 17.2 μs to 200 μs for a DR of eight. When a DR of 64/3 is specified, the TRCAL symbol length can be in the range of 33.3 μs to 225 μs. An acceptable error envelope 1245 is illustrated over the TRCAL range of 17.2 μs to 200 μs for a DR of eight. A shown, the error using right-shifting division 1000 is always negative and exceeds the error envelope at 1290.

One way of overcoming the divide-error problem and performing division 800 accurately is by using a look-up table. The determined TRCAL.NO and DR numbers are indexes into the table, used to look up a BLP from the table. Other ways of overcoming this problem according to the invention are described below.

Figure 13:
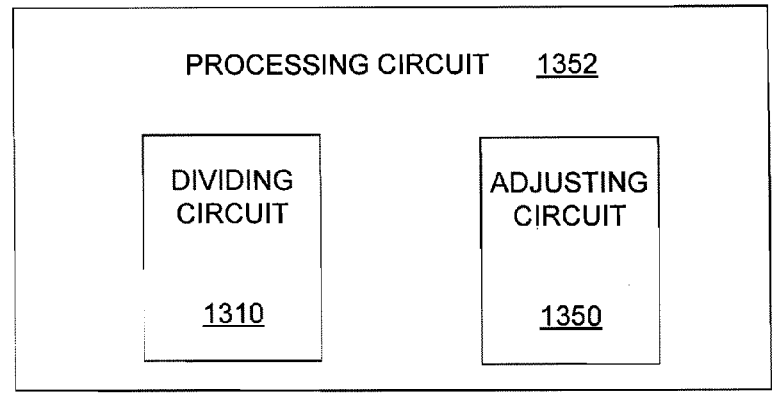
FIG. 13 is a block diagram of a processing circuit of an embodiment of the invention.
Figure 14:
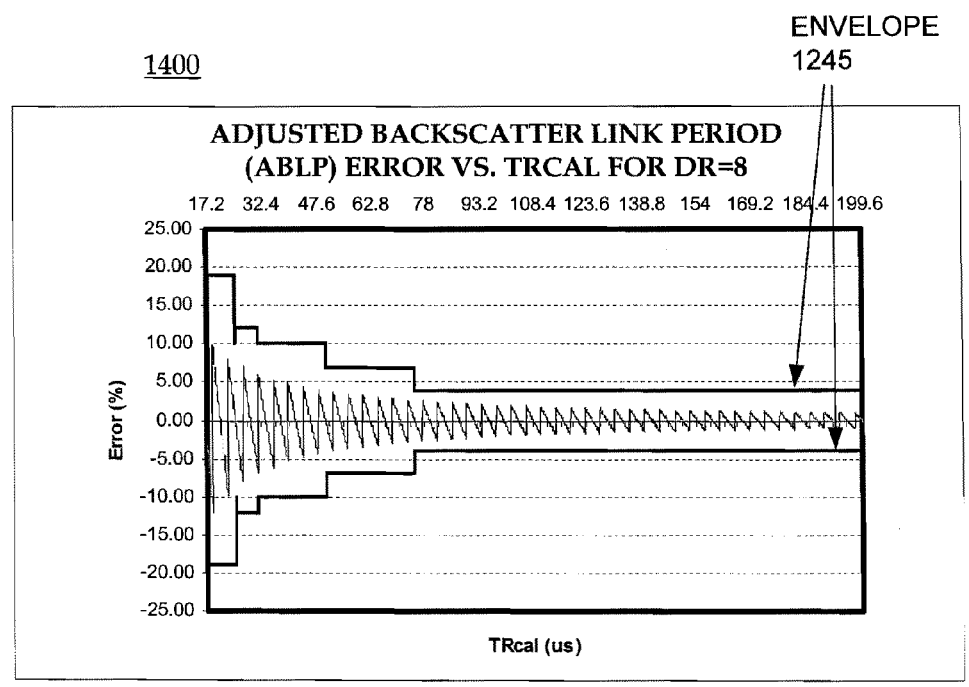
FIG. 14 illustrates error in determining the backscatter parameter using the processing circuitry of FIG. 13.

FIG. 13 is a block diagram of a processing circuit 1352 of an embodiment of the invention. The processing circuit includes a dividing circuit 1310 to divide a TRCAL.NO by a specified DR. An adjusting circuit 1350 is provided to adjust the division process to shift the average error closer to zero. That is, as shown in FIG. 14 a plot 1400 of the error in determining the adjusted backscatter link period (ABLP) using the processing circuitry of FIG. 13 has a mean or average value closer to zero, and does not exceed error envelope 1245.

In one embodiment, an RFID tag comprises a demodulator 442 to demodulate waveforms from an RFID reader that encode a TRCAL and a DR. A processing circuit determines a gross TRCAL.NO from TRCAL as in FIG. 9. Processing circuit 1352 then determines an ABLP by dividing the TRCAL.NO by DR and adding an adjustment. A modulator backscatters a tag waveform having a link period determined from the ABLP. In an embodiment of an RFID tag the adjustment is one of positive and negative.

In an embodiment of an RFID tag it is further determined whether the adjustment is not needed, and if so, the adjustment is not added. The gross number can be expressed in terms of binary digits (bits), and determining whether the adjustment is needed is determined from at least one but not all of the bits.

In an embodiment of an RFID tag the gross number is expressed in terms of bits, and dividing takes place by discarding at least one of the bits. Processing can be further adapted to determine the gross number by counting periodic events during a time duration of a feature of the reader waveform, and then adding the adjustment to the time duration. In one embodiment the adjustment is of fixed magnitude.

Figure 15:
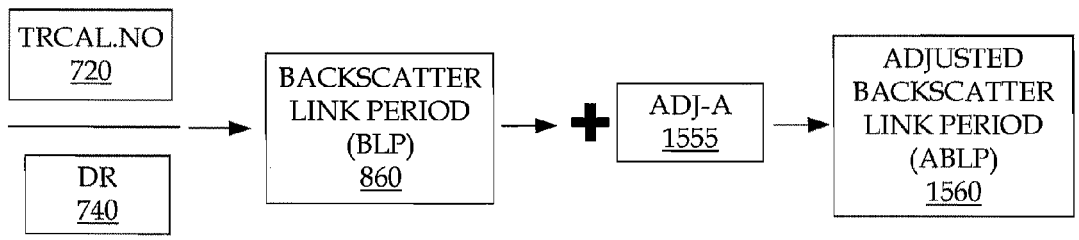
FIG. 15 is a conceptual diagram for explaining a method of determining a backscatter parameter according to an embodiment of the invention.

FIG. 15 is a conceptual diagram for explaining a method 1500 of determining an ABLP according to an embodiment of the invention. In this embodiment of an RFID tag the adjustment ADJ-A 1555 is added after dividing. TRCAL.NO 720 is first divided by DR 740 to determine a BLP 860. Adjustment 1555 is added after the division to determine an ABLP 1560.

Figure 16:
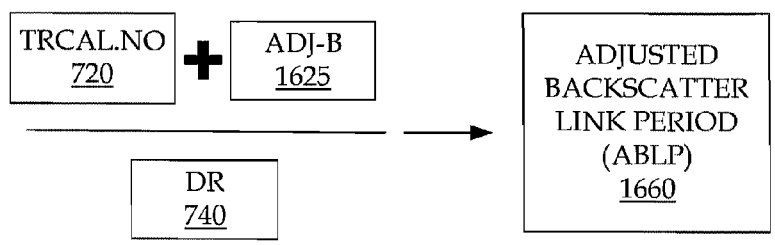
FIG. 16 is a conceptual diagram for explaining another method of determining a backscatter parameter according to an embodiment of the invention.

FIG. 16 is a conceptual diagram for explaining another method 1600 of determining an ABLP according to an embodiment of the invention. In this embodiment, the adjustment is added to TRCAL.NO before dividing. In another embodiment, processing is further adapted to multiply TRCAL.NO by an integer before adding the adjustment. As shown in FIG. 16, TRCAL.NO 720 and adjustment ADJ-B 1625 are added prior to dividing by DR 740, yielding ABLP 1660.

In one embodiment, a method for an RFID tag comprises receiving waveforms from an RFID reader, determining a gross number and a divide ratio from the waveforms, and generating a result by dividing the gross number by the divide ratio and adding an adjustment. The method further comprises backscattering a tag waveform that includes symbols using a link period determined from the result.

In another embodiment the gross number is expressed in terms of bits, and dividing takes place by discarding at least one the bits. The adjustment is one of positive and negative. In further embodiments the adjustment is added before dividing. In yet further embodiments the adjustment is added after multiplying but before dividing.

Figure 17:
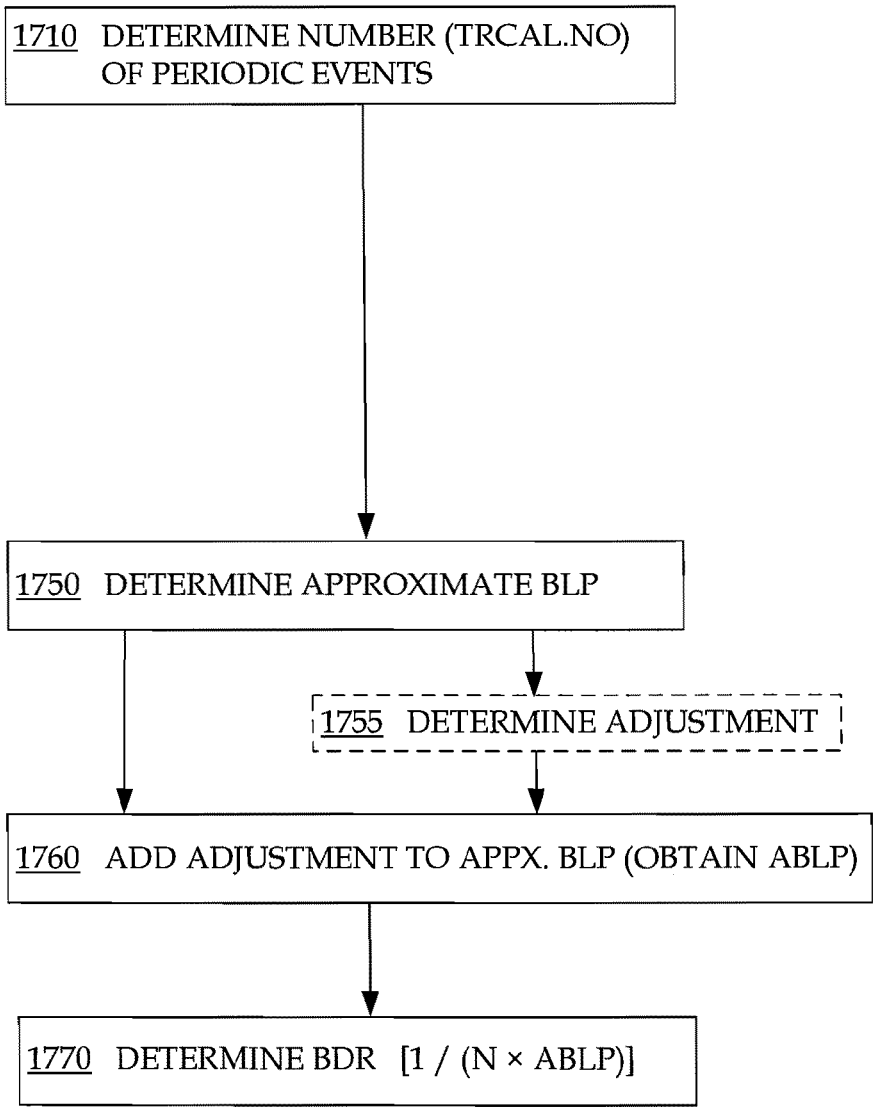
FIG. 17 is a flow chart illustrating a method of adding an adjustment after dividing.

FIG. 17 is a flow chart illustrating a method 1700 of adding an adjustment after dividing. Operation 1710 includes determining a number of periodic events TRCAL.NO during a TRCAL feature of a reader waveform. The periodic events can be rising edges, falling edges, or both rising and falling edges of a clock signal. Further, the events can be other features of a periodic nature, such as high or low times of a clock signal. The number of periodic events is counted, for example by a counter of the RFID tag, and divided by the DR to provide an approximate BLP 1750. In one embodiment, DR is used to determine the adjustment amount 1755. In another embodiment, the divide operation is used to determine the adjustment amount 1755. The adjustment amount is then added to the approximate BLP to determine ABLP 1760. A tag's backscattered waveform may contain symbols whose length are integer multiples N of the ABLP (i.e. have length N×ABLP); equivalently, the tag's backscatter data rate (BDR) 1770 can be determined as BDR=[1/(N×ABLP)].

Figure 18:
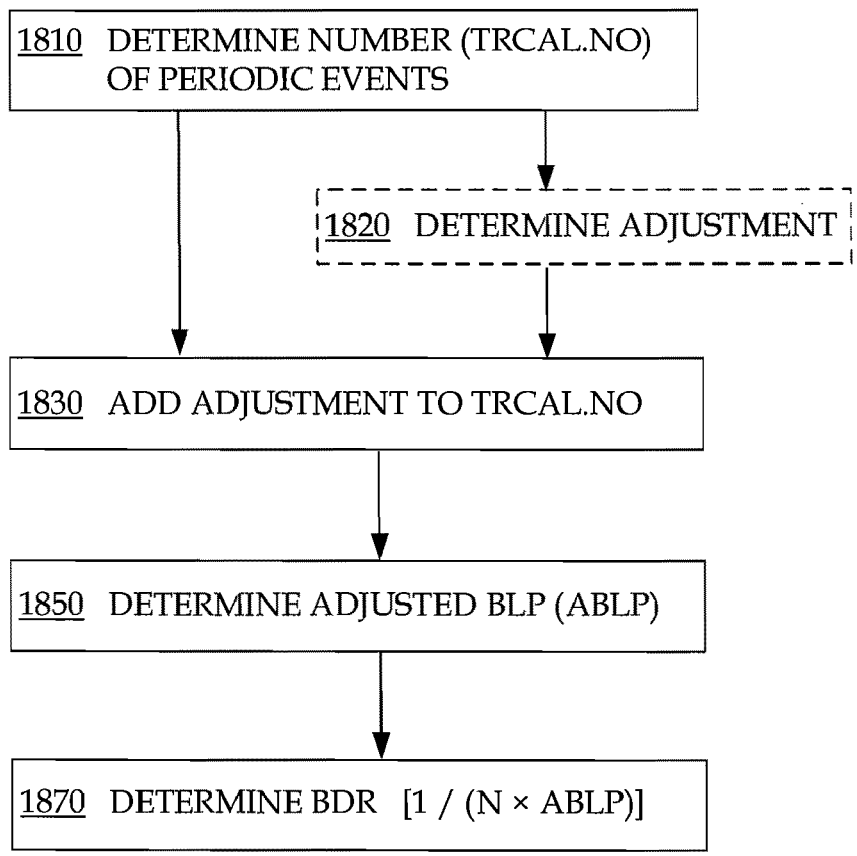
FIG. 18 is a flow chart illustrating a method of adding an adjustment before dividing.

FIG. 18 is a flow chart illustrating a method 1800 of adding an adjustment before dividing. Operation 1810 includes determining a number of periodic events TRCAL.NO during a TRCAL feature of a reader waveform. As stated above, the periodic events can be rising edges, falling edges, or both rising and falling edges of a clock signal. Further, the events can be other features of a periodic nature, such as high or low times of a clock signal. The number of periodic events is counted, for example by a counter of the RFID tag. The DR is used to determine the adjustment amount 1820. The adjustment is added to the gross number TRCAL.NO at operation 1830. The adjusted amount is divided by DR to determine an ABLP at operation 1850. A BDR can then be determined at operation 1870. The BDR is calculated as BDR=[1/(N× ABLP)], where N is an integer.

In one embodiment, the RFID method comprises determining whether the adjustment is needed, and if not, then not adding the adjustment. Further, the gross number can be expressed in terms of bits, and determining whether the adjustment is needed is determined from at least one but not all of the bits.

In another embodiment, the method comprises determining a magnitude of the adjustment. The magnitude of the adjustment can be determined using a lookup table. Alternatively, the magnitude can be determined from DR. In one method the gross number is expressed in terms of bits, and the magnitude is determined from at least one but not all of the bits.

Figure 19:
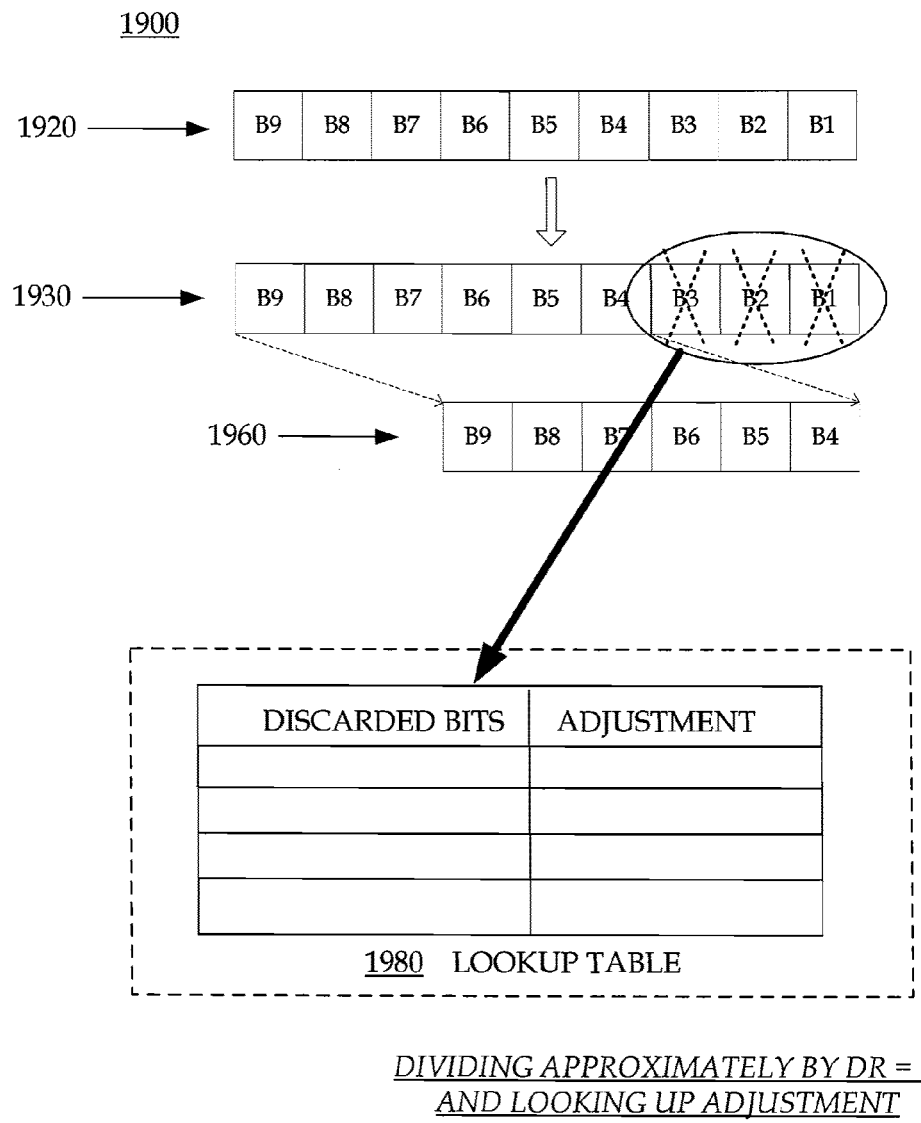
FIG. 19 illustrates a method for determining an adjustment for steps of the flowchart of FIG. 17.

FIG. 19 illustrates a method 1900 which can be used for determining an adjustment 1755 of the flowchart of FIG. 17, or an adjustment 1820 of the flowchart of FIG. 18. As explained above, a right-shift division operation divides a binary number 1920 by discarding one or more of the least-significant bits, as shown at 1930. The result is a divided number 1960. The least-significant bits, such as B1-B3, in one embodiment are used by the tag processing circuitry 652 and memory 648 to access a lookup table 1980. Using the lookup table, the least-significant bits can be used to determine different adjustments for different gross numbers.

As explained above, an RFID tag operates at a low power. This constraint currently precludes using accurate but complicated floating-point multiplication and division. As such, simplified mathematical operations are implemented, such as the explained right-shifting division. Because a reader expects an RFID tag to have a backscatter link period that is calculated by accurately dividing the reader waveform feature, TRCAL, by a specified DR, embodiments of the invention include an adjustment when dividing TRCAL.NO by DR using right-shifting division. Because the division operation can be simplified in different ways, the adjustment can be added prior to dividing or after dividing. Further, the division can be split into different operations with the adjustment done between the operations. Because an RFID tag can be adapted to divide by different divide ratios, a multiplication operation may be performed to simplify the division operation. As explained below, the adjustment can be added to a counter when determining the gross number.

In an embodiment of an RFID tag a processor comprises a counter to count the gross number, and first and second multiplier circuits to multiply an output of the counter by first and second values, respectively, to provide first and second multiplied counts. A multiplexing circuit selects either the first or second multiplied count based on the divide ratio. An adder adds an adjustment to an output of the multiplexing circuit, and a divider circuit divides an output of the adder.

In an embodiment of an RFID tag the processor comprises a counter to count the gross number, wherein the counter begins counting at a non-zero count prior to counting the gross number; and a divider to divide an output of the counter.

In another embodiment of an RFID tag the processor comprises a first counter to count the gross number, wherein the first counter begins counting at a first non-zero count prior to counting the gross number. A second counter is provided to count the gross number, wherein the second counter begins counting at a second non-zero count prior to counting the gross number. The processor further comprises first and second dividers to divide outputs of the first and second counters, and a multiplexing circuit to select an output of either the first or second divider based on a specified divide ratio.

The processor can be further adapted to determine a magnitude of an adjustment. The magnitude can be determined by looking up a value in a table, or the magnitude can be determined from the divide ratio, or both. In one embodiment the gross number is expressed in bits, and the magnitude is determined from at least one but not all of the bits.

The processor can be further adapted to determine the gross number by counting a number of periodic events during a time duration of a feature of the reader waveform, storing the number of periodic events in a register, and adding an adjustment to the register. The adjustment can be one of positive and negative. Further, the adjustment can be added one of before, concurrently with, and after counting.

In one embodiment of a method the adjustment is added to the gross number before dividing it. Further, in one method the gross number is multiplied by an integer before adding. The adjustment can be of fixed magnitude.

Another method comprises determining the gross number by counting a number of periodic events during a time duration of a feature of the reader waveform. The number of periodic events is counted in a counter, and the adjustment is added to the counter. The adjustment can be one of positive and negative. Further, the adjustment can be added one of before, concurrently with, and after counting.

Determining the gross number can comprise counting a number of periodic events during a time duration of a feature of the reader waveform, where the adjustment is added to the counted time duration.

Figure 20:
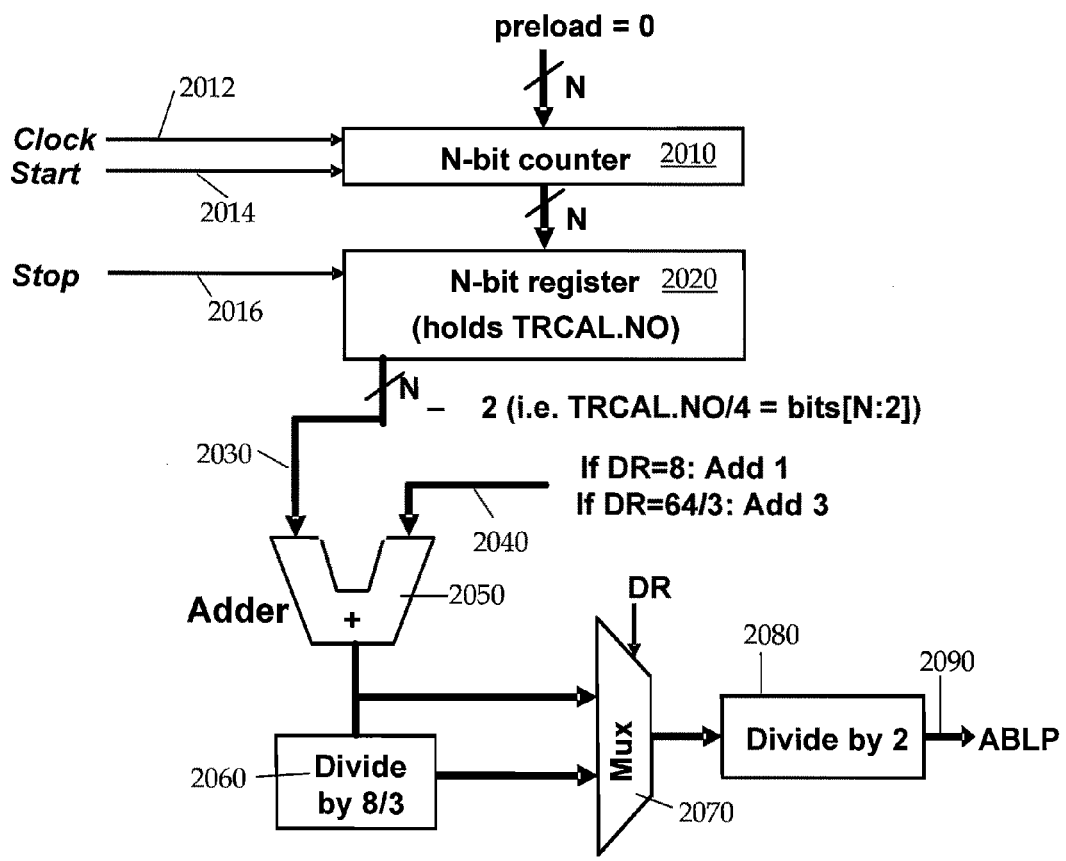
FIG. 20 is a block diagram illustrating processing circuitry according to an embodiment of the invention.

FIG. 20 is a block diagram illustrating processing circuitry 2000 according to an embodiment of the invention. Prior to describing the processing circuitry and its operation an explanation of the implemented and simplified mathematical operations is provided. With ABLP equal to (TRCAL.NO +adjustment)/DR the math can be simplified for different values of DR.

For example, with DR=8 and an adjustment value of four ($100_2$), the math can be simplified by truncating or discarding the two least significant bits of TRCAL.NO before adding an adjustment value of one, and performing a final divide-by-2. That is:

$$ABLP=(TRCAL.NO+4)/8=(TRCAL.NO/4+1)/2$$

Further, with DR=64/3 and an adjustment value of twelve ($1100_2$), the math can be simplified by truncating the two least significant bits of TRCAL.NO before adding three, dividing by 8/3, and performing a final divide-by-2. That is:

$$ABLP = (TRCAL.NO + 12)/(64/3)$$
$$= (TRCAL.NO/4 + 3)/(16/3) = [(TRCAL.NO/4 + 3)/(8/3)]/2$$

Processing circuitry 2000 includes an N-bit counter 2010 to count a number of periodic events. N-bit register 2020 is coupled to load an N-bit output count from the counter. A truncated output (N-2 bits) from the register is provided to adder circuit 2050. The adder circuit is coupled to multiplexing circuit 2070, and to divide circuitry 2060 to divide the adder output by 8/3. Multiplexing circuit 2070 is provided to select an output from either the divide circuitry 2060 or the adder circuit 2050. Divider circuit 2080 divides an output of the multiplexing circuit to provide the ABLP at 2090.

In operation, counter 2010 is preloaded to a zero count. The counter starts counting periodic Clock events 2012 in response to a Start signal 2014. The Start signal corresponds to the beginning of the TRCAL symbol of the reader waveform. At the end of the TRCAL symbol a Stop signal 2016 instructs register 2020 to load the counter's N-bit count. This count represents a gross number TRCAL.NO to be processed. The output of the register is truncated to remove the two least significant bits. That is, the gross number is divided by four prior to adding an adjustment.

The adder circuit 2050 selectively adds either a value of one or three to the truncated count. If the DR value is eight, the adder circuit adds one and an output of the adder circuit is coupled through multiplexing circuit 2070 to be divided by two by divider circuit 2080.

If the DR value is 64/3, the adder circuit adds three and an output of the adder circuit is coupled to divider circuit 2060 to be divided by 8/3. The result is coupled through multiplexing circuit 2070 to be divided by two by divider circuit 2080.

The example implementation divides the gross number by the divide ratio and adds an adjustment, to reduce the mean or average link-period error closer to zero.

Figure 21:
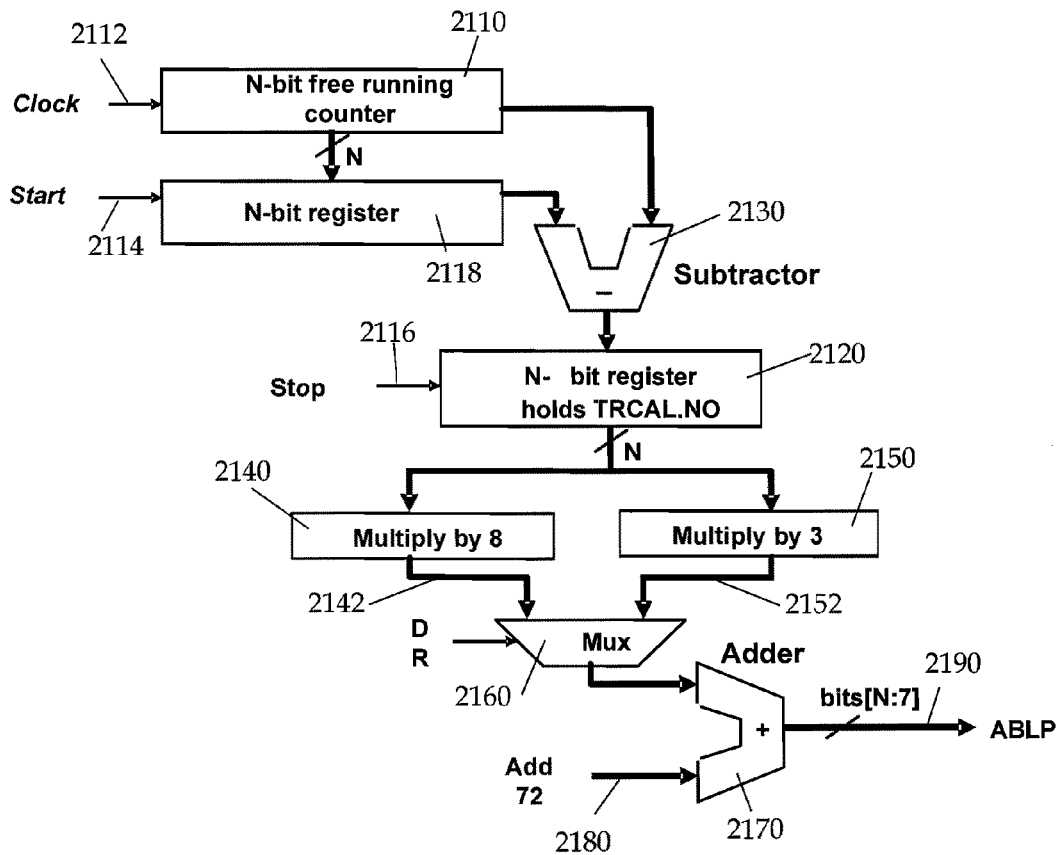
FIG. 21 is a block diagram illustrating processing circuitry according to another embodiment of the invention.

FIG. 21 is a block diagram illustrating processing circuitry 2100 according to another embodiment of the invention. If the rate of the periodic events during TRCAL are increased, such as by counting both rising and falling edges of a clock signal, then the adjustment value may need to be changed. This is the case in exemplary implementation 2100.

For example, with DR=8 an adjustment of nine may be used and with DR=64/3 an adjustment of 24 may be used. That is, the starting equations are:

$$ABLP=(TRCAL.NO+9)/(2\times8), \text{ for DR=8, and}$$

$$ABLP=(TRCAL.NO+24)/(2\times(64/3)), \text{ for DR=64/3.}$$

Notice that the increased gross count from the doubled periodic event count required the effective divide ratio to be doubled. These equations can be simplified with a common denominator of 128 as:

$$ABLP=(8\times TRCAL.NO+72)/128, \text{ for DR=8, and}$$

$$ABLP=(3\times TRCAL.NO+72)/128, \text{ for DR=64/3.}$$

Processing circuitry 2100 is configured to implement both of these equations. An N-bit free running counter 2110, and register 2118, are coupled to count periodic events from clock 2112. Because the counter is free running, a subtractor circuit 2130 is used to subtract a start value from the counter output.

In operation, counter 2110 is counting periodic events from Clock 2112. In response to the Start signal 2114 register 2118 loads a start count. The start count is subtracted from the running count by subtractor circuit 2130. This subtracted count is provided to register 2120. In response to a Stop signal 2116 register 2120 holds a count representing the TRCAL length (i.e. TRCAL.NO).

As explained in the above equations, TRCAL.NO is multiplied by either eight or three prior to adding an adjustment of 72. Multiplier circuits 2140 and 2150 multiply the output of register 2120 by eight and three, respectively.

Multiplexing circuit 2160 selects either output 2142 or output 2152 from the multiplier circuits, based on the DR value. The multiplexer output is then coupled to adder circuit 2170 to add a value of 72 (applied at 2180). The adder output is divided by 128 to provide the ABLP at 2190. In one embodiment, the division is performed by right-shifting the adder output by seven bits. This example implementation divides the gross number by the divide ratio and adds an adjustment to reduce the mean or average link-period error closer to zero.

Figure 22:
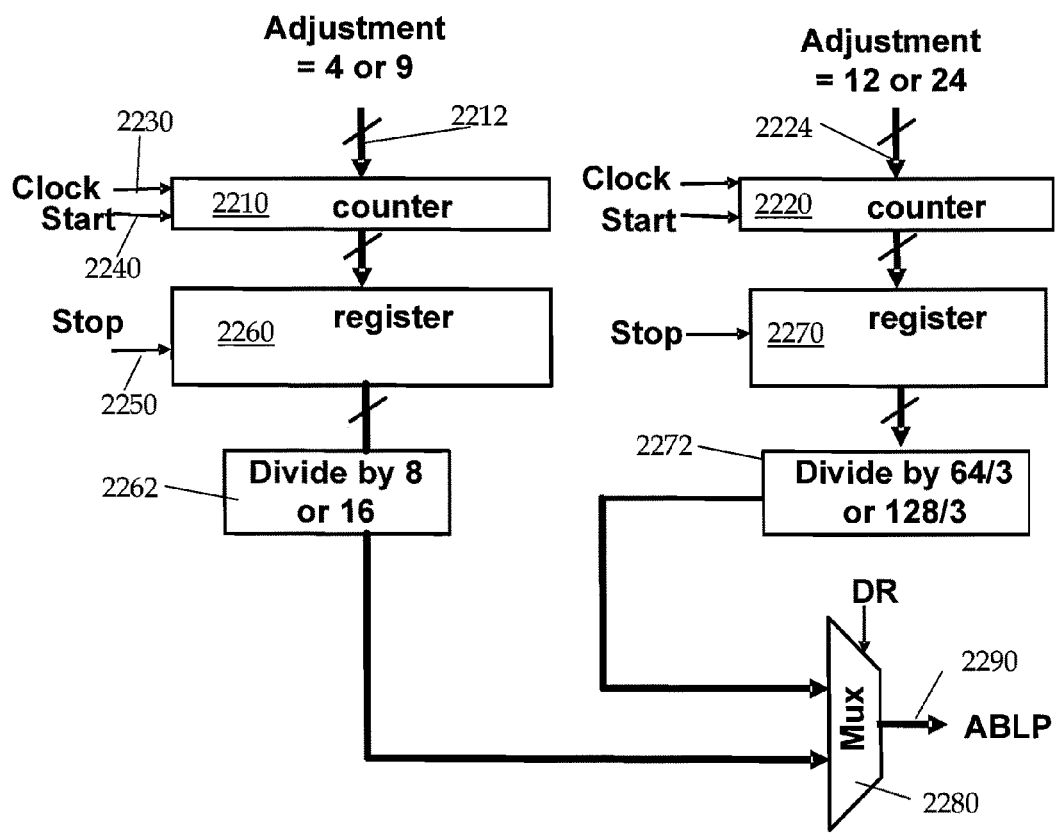
FIG. 22 is a block diagram illustrating processing circuitry according to another embodiment of the invention.

FIG. 22 is a block diagram illustrating processing circuitry 2200 according to another embodiment of the invention. In this embodiment, two counters 2210 and 2220 are coupled to Clock signal 2230 and Start signal 2240. Each counter is coupled to a register 2260 or 2270. An output of register 2260 is coupled to divider circuit 2262. likewise, an output of register 2270 is coupled to divider circuit 2272. A multiplexing circuit 2280 selects either the output from divider circuit 2262 or 2272 as the ABLP at 2290.

In operation, counter 2210 is preloaded with an adjustment of four or nine. The adjustment value is determined by the periodic events counted. That is, for a counter that counts single clock event (rising or falling edge only) the adjustment value is four, whereas for a counter that counts double clock events (rising and falling edges) the adjustment value is nine. In response to the Start signal 2240 counter 2210 starts counting from the preloaded value. In response to the Stop signal 2250 register 2260 loads the counter's output. The gross number for TRCAL.NO, therefore, has an adjustment value added thereto by the counter 2210. The resultant value is then divided by a DR of 8 for single clock events or by a DR of 2×8 for double clock events.

Counter 2220 is preloaded with an adjustment of 12 or 24. The adjustment value is determined by the periodic events counted. That is, for a counter that counts single clock event (rising or falling edge only) the adjustment value is 12, whereas for a counter that counts double clock events (rising and falling edges) the adjustment value is 24. In response to the Start signal 2240 counter 2220 starts counting from the preloaded value. In response to the Stop signal 2250 register 2270 loads the counter's output. The gross number for TRCAL.NO, therefore, has an adjustment value added thereto by the counter 2220. The resultant value is then divided by a DR of 64/3 for single clock events or by a DR of 2×64/3 for double clock events.

This example implementation divides the gross number by the divide ratio and adds an adjustment to reduce the mean or average link-period error closer to zero.

What is claimed is:

1. An RFID tag comprising:
   a demodulator to demodulate waveforms from an RFID reader that encode a gross number and a divide ratio, the gross number being expressed in terms of bits;
   a processor to determine a result by dividing the gross number by the divide ratio and adding an adjustment, in which the dividing takes place by discarding at least one of the bits; and
   a modulator to backscatter a tag waveform that includes symbols using a symbol period determined from the result.

2. The tag of claim 1, in which
   it is further determined whether the adjustment is not needed, and
   if so, the adjustment is not added.

3. The tag of claim 2, in which
   determining whether the adjustment is needed is determined from at least one but not all of the bits.

4. The tag of claim 1, in which
   the adjustment is one of positive and negative.

5. The tag of claim 1, in which
   the adjustment is added after dividing.

6. The tag of claim 1 in which the processor comprises:
   a counter to count the gross number;
   first and second multiplier circuits to multiply an output of the counter by first and second values, respectively, to provide first and second multiplied counts;
   a multiplexing circuit to select either the first or second multiplied count based on the divide ratio;
   an adder for adding the adjustment to an output of the multiplexing circuit; and
   a divider circuit to divide an output of the adder.

7. The tag of claim 1 in which the processor comprises:
   a counter to count the gross number, wherein the counter begins counting at a non-zero adjustment prior to counting the gross number; and
   a divider to divide an output of the counter.

8. The tag of claim 1 in which the processor comprises:
   a first counter to count the gross number, wherein the first counter begins counting at a first non-zero adjustment prior to counting the gross number;
   a second counter to count the gross number, wherein the second counter begins counting at a second non-zero adjustment prior to counting the gross number;
   first and second dividers to divide outputs of the first and second counters; and
   a multiplexing circuit to select an output of either the first or second divider based upon a specified divide ratio.

9. The tag of claim 1, in which the processor is further adapted to
   determine the gross number by counting a number of periodic events during a time duration of a feature of the reader waveform, and where the adjustment is added to the time duration.

10. The tag of claim 1, in which
the adjustment is added to the gross number before dividing.
11. The tag of claim 10, in which the processor is further adapted to
multiply by an integer before adding.
12. The tag of claim 1, in which
the adjustment is of fixed magnitude.
13. The tag of claim 1, in which the processor is further adapted to
determine a magnitude of the adjustment.
14. The tag of claim 13, in which
the magnitude is determined by looking up a value in a table.
15. The tag of claim 13, in which
the magnitude is determined from the divide ratio.
16. The tag of claim 13, in which
the magnitude is determined from at least one but not all of the bits.
17. The tag of claim 1, in which the processor is further adapted to
determine the gross number by counting a number of periodic events during a time duration of a feature of the reader waveform, and
in which the number of periodic events is counted by a counter, and
the adjustment is added to the count.
18. The tag of claim 17, in which
the adjustment is one of positive and negative.
19. The tag of claim 17, in which
the adjustment is added one of before, concurrently with, and after counting.
20. A device comprising:
means for receiving waveforms from an RFID reader;
means for determining a gross number and a divide ratio from the waveforms, the gross number being expressed in terms of bits;
means for generating a result by dividing the gross number by the divide ratio and adding an adjustment, in which the dividing takes place by discarding at least one of the bits; and
means for backscattering a tag waveform that includes symbols using a symbol period determined from the result.
21. The device of claim 20, further comprising:
means for determining whether the adjustment is needed, and
if not, not adding the adjustment.
22. The device of claim 21, in which
determining whether the adjustment is needed is determined from at least one but not all of the bits.
23. The device of claim 20, in which
the adjustment is one of positive and negative.
24. The device of claim 20, in which
the adjustment is added after dividing.
25. The device of claim 20, in which
the adjustment is added to the gross number before dividing.
26. The device of claim 25, further comprising:
means for multiplying by an integer before adding.
27. The device of claim 20, in which
the adjustment is of fixed magnitude.
28. The device of claim 20, further comprising:
means for determining a magnitude of the adjustment.
29. The device of claim 28, in which
the magnitude is determined by looking up a value in a table.
30. The device of claim 28, in which
the magnitude is determined from the divide ratio.
31. The device of claim 28, in which
the magnitude is determined from at least one but not all of the bits.
32. The device of claim 20, further comprising:
a counter for determining the gross number by counting a number of periodic events during a time duration of a feature of the reader waveform, and wherein the adjustment is added to the count.
33. The device of claim 32, in which
the adjustment is one of positive and negative.
34. The device of claim 32, in which
the adjustment is added one of before, concurrently with, and after counting.
35. The device of claim 20, in which determining the gross number comprises:
means for counting a number of periodic events during a time duration of a feature of the reader waveform, where the adjustment is added to the time duration.
36. A method for an RFID tag comprising:
receiving waveforms from an RFID reader;
determining a gross number and a divide ratio from the waveforms, the gross number being expressed in terms of bits;
generating a result by dividing the gross number by the divide ratio and adding an adjustment, in which the dividing takes place by discarding at least one of the bits; and
backscattering a tag waveform that includes symbols using a symbol period determined from the result.
37. The method of claim 36, further comprising:
determining whether the adjustment is needed, and
if not, not adding the adjustment.
38. The method of claim 37, in which
determining whether the adjustment is needed is determined from at least one but not all of the bits.
39. The method of claim 36, in which
the adjustment is one of positive and negative.
40. The method of claim 36, in which
the adjustment is added after dividing.
41. The method of claim 36, in which
the adjustment is added to the gross number before dividing.
42. The method of claim 41, further comprising:
multiplying by an integer before adding.
43. The method of claim 36, in which
the adjustment is of fixed magnitude.
44. The method of claim 36, further comprising:
determining a magnitude of the adjustment.
45. The method of claim 44, in which
the magnitude is determined by looking up a value in a table.
46. The method of claim 44, in which
the magnitude is determined from the divide ratio.
47. The method of claim 44, in which
the magnitude is determined from at least one but not all of the bits.
48. The method of claim 36, further comprising:
determining the gross number by counting a number of periodic events during a time duration of a feature of the reader waveform,
the number of periodic events is counted in a counter, and
the adjustment is added to the count.
49. The method of claim 48, in which
the adjustment is one of positive and negative.
50. The method of claim 48, in which the adjustment is added one of before, concurrently with, and after counting.

51. The method of claim 36, in which determining the gross number comprises:
counting a number of periodic events during a time duration of a feature of the reader waveform, where the adjustment is added to the time duration.

52. A circuit for an RFID tag having an antenna, comprising:
a demodulator to demodulate waveforms by the antenna that encode a gross number and a divide ratio, the gross number being expressed in terms of bits;
a processor to determine a result by dividing the gross number by the divide ratio and adding an adjustment, in which the dividing takes place by discarding at least one of the bits; and
a modulator to backscatter via the antenna a tag waveform that includes symbols using a symbol period determined from the result.

53. The circuit of claim 52, in which
it is further determined whether the adjustment is not needed, and
if so, the adjustment is not added.

54. The circuit of claim 53, in which
determining whether the adjustment is needed is determined from at least one but not all of the bits.

55. The circuit of claim 52, in which
the adjustment is one of positive and negative.

56. The circuit of claim 52, in which
the adjustment is added after dividing.

57. The circuit of claim 52 in which the processor comprises:
a counter to count the gross number;
first and second multiplier circuits to multiply an output of the counter by first and second values, respectively, to provide first and second multiplied counts;
a multiplexing circuit to select either the first or second multiplied count based on the divide ratio;
an adder for adding the adjustment to an output of the multiplexing circuit; and
a divider circuit to divide an output of the adder.

58. The circuit of claim 52 in which the processor comprises:
a counter to count the gross number, wherein the counter begins counting at a non-zero adjustment prior to counting the gross number; and
a divider to divide an output of the counter.

59. The circuit of claim 52 in which the processor comprises:
a first counter to count the gross number, wherein the first counter begins counting at a first non-zero adjustment prior to counting the gross number;
a second counter to count the gross number, wherein the second counter begins counting at a second non-zero adjustment prior to counting the gross number;
first and second dividers to divide outputs of the first and second counters; and
a multiplexing circuit to select an output of either the first or second divider based upon a specified divide ratio.

60. The circuit of claim 52, in which the processor is further adapted to:
determine the gross number by counting a number of periodic events during a time duration of a feature of the reader waveform, and where the adjustment is added to the time duration.

61. The circuit of claim 52, in which
the adjustment is added to the gross number before dividing.

62. The circuit of claim 61, in which the processor is further adapted to:
multiply by an integer before adding.

63. The circuit of claim 52, in which
the adjustment is of fixed magnitude.

64. The circuit of claim 52, in which the processor is further adapted to:
determine a magnitude of the adjustment.

65. The circuit of claim 64, in which
the magnitude is determined by looking up a value in a table.

66. The circuit of claim 64, in which
the magnitude is determined from the divide ratio.

67. The circuit of claim 64, in which
the magnitude is determined from at least one but not all of the bits.

68. The circuit of claim 52, in which the processor is further adapted to:
determine the gross number by counting a number of periodic events during a time duration of a feature of the reader waveform, and
in which the number of periodic events is counted by a counter, and
the adjustment is added to the count.

69. The circuit of claim 68, in which
the adjustment is one of positive and negative.

70. The circuit of claim 68, in which
the adjustment is added one of before, concurrently with, and after counting.

* * * * *